United States Patent
Koch et al.

(10) Patent No.: US 9,244,123 B1
(45) Date of Patent: Jan. 26, 2016

(54) SYNCHRONOUS CIRCUIT, METHOD OF DESIGNING A SYNCHRONOUS CIRCUIT, AND METHOD OF VALIDATING A SYNCHRONOUS CIRCUIT

(71) Applicants: Thomas Koch, Kaufering (DE); Ilhan Hatirnaz, Munich (DE); Michael Rohleder, Unterschleissheim (DE)

(72) Inventors: Thomas Koch, Kaufering (DE); Ilhan Hatirnaz, Munich (DE); Michael Rohleder, Unterschleissheim (DE)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/552,543

(22) Filed: Nov. 25, 2014

(51) Int. Cl.
*G06F 17/50* (2006.01)
*G01R 31/317* (2006.01)
*G01R 31/3177* (2006.01)

(52) U.S. Cl.
CPC ...... *G01R 31/31726* (2013.01); *G01R 31/3177* (2013.01); *G01R 31/31727* (2013.01); *G06F 17/505* (2013.01)

(58) Field of Classification Search
CPC .... H04M 3/24; G02F 1/13318; G02F 1/0121; G06F 13/16; G06F 13/12; G06F 11/00; G06F 11/0757; G06F 11/1008; G06F 11/141; G06F 11/1629; G06F 11/1633; G06F 11/1641; G06F 11/1645; G06F 11/165
USPC ................. 716/100–106, 136–139
See application file for complete search history.

(56) References Cited

U.S. PATENT DOCUMENTS 5,233,617 A    8/1993   Simmons et al.
6,025,744 A    2/2000   Bertolet et al.
(Continued)

FOREIGN PATENT DOCUMENTS

GB    2404055 A    1/2005
WO    2006056824 A    6/2006

OTHER PUBLICATIONS

Liu, Q. et al., "Capturing Post-Silicon Variations Using a Representative Critical Path," IEEE Transactions on Computer-Aided Design of Integrated Circuits and Systems, vol. 29, Issue 2, Feb. 2010; pp. 211-222.

(Continued)

*Primary Examiner* — Binh Tat

(57) ABSTRACT

A synchronous circuit comprises a functional circuitry and one or more validation circuits for validating synchronization of the functional circuitry. The functional and the validation circuits are clocked by a clock source. Each validation circuit comprises a clock distribution network, a test signal generator, a capture cell, a test signal path from the test signal generator to the capture cell, and a verification unit. The clock distribution network applies a launch clock signal at the test signal generator and a capture clock signal at the capture cell. The test signal generator produces a bi-level test signal. The test signal path transmits the test signal to the capture cell, which generates a proof sequence by sampling the test signal. The verification unit determines whether the proof sequence is identical to the test sequence.

A method of designing a synchronous circuit and method of validating a synchronous circuit are also described.

20 Claims, 15 Drawing Sheets

(56) References Cited

U.S. PATENT DOCUMENTS

| | | | |
|---|---|---|---|
| 6,108,794 | A | 8/2000 | Erickson |
| 6,169,419 | B1 | 1/2001 | De et al. |
| 6,300,809 | B1 | 10/2001 | Gregor et al. |
| 7,142,623 | B2 | 11/2006 | Sorna |
| 7,310,755 | B2 | 12/2007 | Mudge et al. |
| 7,320,091 | B2 | 1/2008 | Blaauw et al. |
| 7,337,356 | B2 | 2/2008 | Mudge et al. |
| 7,650,551 | B2 | 1/2010 | Flautner et al. |
| 8,381,009 | B2 | 2/2013 | Priel et al. |
| 8,677,306 | B1 * | 3/2014 | Andreev et al. ............... 716/136 |
| 2003/0094934 | A1 * | 5/2003 | Date et al. .................... 324/73.1 |
| 2003/0146777 | A1 * | 8/2003 | Nadeau-Dostie et al. ...... 326/93 |
| 2004/0008056 | A1 | 1/2004 | Kursun et al. |
| 2005/0229059 | A1 | 10/2005 | Hirano |
| 2009/0315601 | A1 | 12/2009 | Priel et al. |
| 2010/0244937 | A1 | 9/2010 | Anidjar et al. |

OTHER PUBLICATIONS

Ernst et al., "Razor: A low power pipeline based on circuit-level timing speculation," IEEE 36th Annual International Symposium on Microarchitecture, Dec. 2003, 12 pages.

Kaul et al., "DVS for on-chip bus designs based on timing error correction," IEEE, Proceedings of the Design, Automation, and Test in Europe Conference and Exhibition, Dec. 2005, 6 pages.

Non-Final Office Action mailed Jun. 29, 2011 for U.S. Appl. No. 12/376,071, 11 pages.

Final Office Action mailed Jan. 6, 2011 for U.S. Appl. No. 12/376,071, 11 pages.

Non-Final Office Action mailed Oct. 7, 2011 for U.S. Appl. No. 12/376,074, 16 pages.

Final Office Action mailed Feb. 9, 2012 for U.S. Appl. No. 12/376,074, 14 pages.

Notice of Allowance mailed Apr. 18, 2012 for U.S. Appl. No. 12/376,074, 6 pages.

* cited by examiner

SYNCHRONOUS CIRCUIT, METHOD OF DESIGNING A SYNCHRONOUS CIRCUIT, AND METHOD OF VALIDATING A SYNCHRONOUS CIRCUIT

FIELD OF THE INVENTION

This invention relates to a synchronous circuit, a method of designing a synchronous circuit, and a method of validating a synchronous circuit.

BACKGROUND OF THE INVENTION

The vast majority of integrated circuits (ICs) are synchronous circuits. In a synchronous circuit, one or more clock signals are used to synchronize data transfers between sequential elements. A data signal must be timed correctly relative to a clock edge for capturing the data signal. This is an essential requirement for sequential elements to behave correctly. At least three timing specifications may identify the requirements for ensuring reliable operation of the sequential elements, namely, a setup time, a hold time, and a minimum period duration. The setup time is the minimum time a data signal must be kept stable before a capturing clock edge. The hold time is the minimum time a data signal must be kept stable after the capturing clock edge. The minimum period duration is the minimum required length of the clock period.

Because of the importance of the clock signals for the correct behavior of the synchronous circuit, a lot of attention is given to the related implementation methods, and also the corresponding verification steps. Implementation and verification can, however, be complicated due to the impact of device routing on the distribution of signals and the statistical nature of fabrication variances. The timing behavior of a synchronous circuit may also be influenced by phenomena or conditions like, e.g., the die temperature, IR drop effects, and the operating voltage. Another complication may arise when several clock sources are allowed for the synchronous circuit in question, especially if each clock source can be arranged, e.g., programmed, to provide multiple clock frequencies to a single clock tree.

A design process for specifying a new synchronous device may be based on timing constraints, which identify requirements for a clock tree. These constraints can be evaluated by, e.g., specific electronic design automation (EDA) tools which ensure that the resulting logic and its physical implementation meet the requirements formulated in terms of constraints. Timing constraints are commonly used in synthesis tools, placement algorithms, routing of clock and data signals, and related optimizations, and in verification methods such as Static Timing Analysis (STA).

Constraints may describe, for example, frequency-related aspects of the clock behavior as well as exceptions for supporting data paths that require multiple clock cycles to complete. Determining the constraints on the basis of a specification can in many aspects be a manual effort and the correctness of the thus-determined constraints can often be ensured only by reviews. Another method for verifying timing behavior comprises gate-level simulations with timing information extracted from a physical implementation of the synchronous circuit. Such timing simulations may, however, be limited in their coverage because they may be capable of detecting an error only when an error scenario is stimulated. It may be impossible to stimulate all possible paths due to the runtime of such simulations, the amount of options, and the complexity of identifying and creating all corresponding stimuli.

Another problem which may arise is that of verifying that a given semiconductor device uses a correct clock setup. A variety of methods have been devised for this purpose. One implementation uses additional hardware elements as check elements to measure the frequency of the clock to be verified with respect to a second clock, which is assumed to have a known frequency. For this purpose, the parameters of the expected clock frequency have to be specified in relation to the known clock. This may be performed using software and may have to be adjusted whenever the clock setup changes. Any incorrect or missing programming of the check elements or any false assumption may result in failures or unreliable device behavior. On the other hand, in some cases the actual device may operate correctly, even when overclocked. The method, however, requires using parameter values that allow a safe setup using assumptions of the specification. In another method, analog delay elements are arranged on a clock path so that they prompt a certain action when a certain clock parameter is incorrect.

Thus, while there are methods for verifying the correct clock setup within a semiconductor device, only few of them are related to the set of constraints that is actually used in implementing the logic and the related clock trees. Therefore, assumptions made during physical implementation of the semiconductor design are not necessarily fulfilled. Larger discrepancies can in some cases be detected quickly by the resulting device malfunctions, while small errors in the setup may pass unnoticed. Also, the need for programming a large number of check devices may result in similar mistakes, while the absence of such programming may cause the check devices to be turned off. This may cause an unreliable behavior that can rarely be noticed. It may even cause physical damage to a device when in effect for longer duration.

There is a need for a simple, easily implementable verification structure that detects when the clock setup causes unreliable behavior.

A synchronous circuit is a circuit that comprises at least two, and typically a great number of, sequential logic elements that are synchronized, or clocked, by one or more clock signals. A logic element, e.g., a stateful element such as a latch, a flip-flop, or register, or a stateless element such as a gate, an inverter, or a multiplexor, may be referred to herein as a cell.

In a typical scenario, a launch cell outputs a data signal, e.g., a bi-level signal, in response to triggering edges of a launch clock signal applied at the launch cell. The data signal propagates to a capture cell via a data signal path. The capture cell samples the data signal in response to triggering edges of a capture clock signal which has the same clock rate, i.e., clock frequency, as the launch clock cell. Depending on the implementation, only rising edges or only falling edges are triggering edges, or both rising edges and falling edges are triggering edges.

The data signal arriving at the capture cell needs to be timed correctly relative to the capture clock signal for the capture cell to sample the data signal correctly. Typically, three timing requirements must be satisfied to ensure that the capture cell samples the data signal correctly: a setup time, a hold time, and a minimum period duration. The setup time is the minimum time before a capturing clock edge during which the data signal must be stable. The hold time is the minimum time after the capturing clock edge during which the data signal must be stable. The minimum period duration is the minimum required length of the clock period. The clock period is the duration of one clock cycle, e.g., the time from one rising edge to the next rising edge of the clock signal.

Verifying that a synchronous circuit satisfies the timing requirements for all of its components can be difficult on account of the large number of clocked components of the synchronous circuit, the statistical nature of fabrication variances, and physical parameters or effects which may have an influence on timing, such as temperature, current-resistance (IR) drop effects, and the operating voltage. Furthermore, a synchronous circuit does not necessarily comprise its own intrinsic clock source but may be arranged to receive a clock signal from an external clock. It may therefore be necessary to verify correct synchronization of the synchronous circuit for a whole range of possible clock frequencies.

SUMMARY OF THE INVENTION

The present invention provides a synchronous circuit, a method of designing a synchronous circuit, and a method of validating a synchronous circuit as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Figure 1:
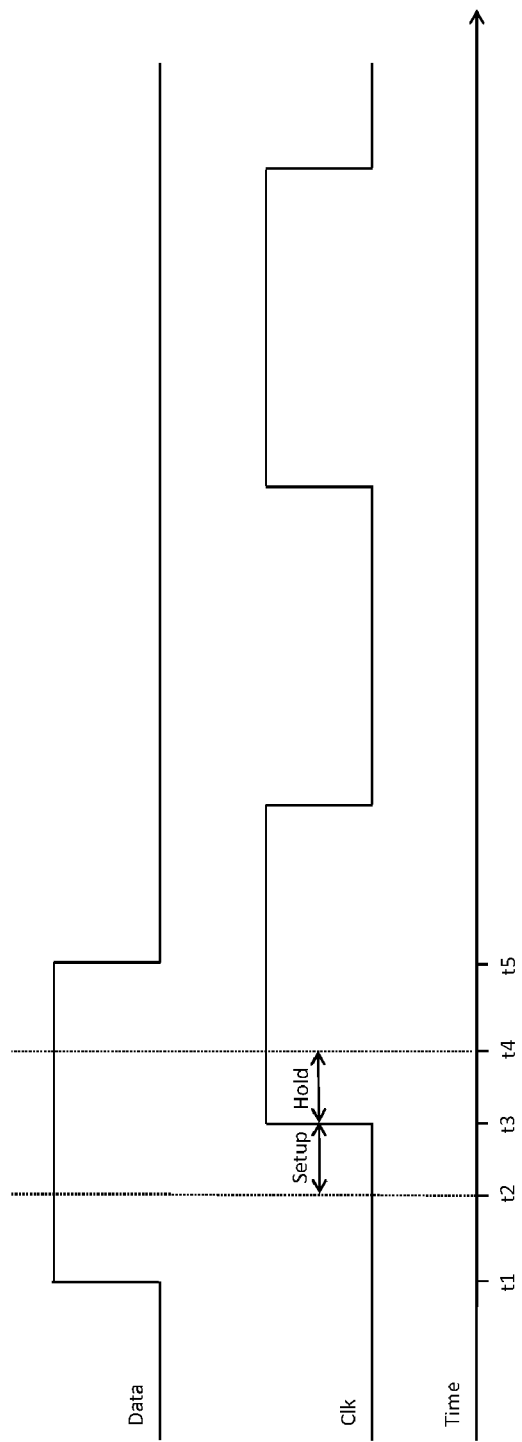
FIG. 1 schematically shows an example of a capture clock signal and a data signal.

A synchronous circuit, comprising a clock source, functional circuitry, and one or more validation circuits for validating synchronization of the functional circuitry is proposed. The functional circuitry and the one or more validation circuits are connected or connectable to the clock source so as to be clocked by the clock source. Each of said one or more validation circuits comprises a clock distribution network, a test signal generator, a capture cell, a test signal path from the test signal generator to the capture cell, and a verification unit.

The clock distribution network may be connected or connectable to the clock source so as to apply a launch clock signal at the test signal generator and a capture clock signal at the capture cell, the launch clock signal and the capture clock signal having the same clock rate. The clock distribution network may, for example, comprise a launch clock path and a capture clock path. At least one of the launch clock path and the capture clock path may comprise one or more non-clocked logic cells connected in series.

The test signal generator may be arranged to produce a bi-level test signal in response to triggering edges of the launch clock signal, the bi-level test signal representing a binary test sequence. The test sequence may be an alternating sequence. For example, the test signal generator may comprise: a launch cell having a state input and a state output, and a feedback loop which connects the state output back to the state input. The test signal path may be arranged to transmit, e.g., to deliver or to relay, the test signal to the capture cell.

The capture cell may be arranged to generate a proof sequence by sampling the test signal in response to triggering edges of the capture clock signal. The test signal path may comprise one or more non-clocked logic cells connected in series. Each of the non-clocked logic cells may be taken from a standard cell library, e.g., from a standard cell library as used by a synthesis program when generating logic from a register transfer level (RTL) description. Preferably, none of the non-clocked logic cells requires any specific trimming, calibration, or manual intervention to ensure its correct timing and its correct behavior.

The verification unit may be arranged to determine whether the proof sequence is identical to the test sequence. For example, the verification unit may be arranged to determine, for each bit of the proof sequence, whether the respective bit is the inverse of the preceding bit of the proof sequence.

The one or more validation circuits may include a hold time test circuit. The clock distribution network of the hold time test circuit may be arranged to produce a positive clock skew between the capture clock signal and the launch clock signal. The positive clock skew may be equal to or greater than a maximum possible positive clock skew between sequentially-adjacent stateful elements of the functional circuitry. The test signal path of the hold time test circuit may have a signal propagation time which is as short as or shorter than a minimum possible signal propagation time between sequentially-adjacent elements of the functional circuitry.

The one or more validation circuits may include a setup time test circuit. The clock distribution network of the setup time test circuit may be arranged to produce a negative clock skew between the capture clock signal and the launch clock signal. The negative clock skew may be equal to or greater than a maximum possible negative clock skew between sequentially-adjacent stateful elements of the functional circuitry. The test signal path of the setup time test circuit may have a signal propagation time which is as long as or longer than a maximum possible signal propagation time between sequentially-adjacent elements of the functional circuitry.

The one or more validation circuits may include a period test circuit. The clock distribution network of the period test circuit may be arranged to produce a clock skew between the launch clock signal and the capture clock signal which may be substantially zero, e.g., less than five percent or less than two percent of the clock period. The test signal path of the period test circuit may have a signal propagation time which is as long as or longer than a maximum possible signal propagation time between sequentially-adjacent stateful elements of the functional circuitry.

Also, the one or more validation circuits may include a first validation circuit and a second validation circuit, wherein the first validation circuit has a first timing violation detection threshold and the second validation circuit has a second timing violation detection threshold which is different from the first timing violation detection threshold. In one example, the group consisting of the first validation circuit and the second validation circuit may comprise a shared test sequence generator connected to the capture cell of the first validation circuit and to the capture cell of the second validation circuit, thus providing the test sequence generator of the first validation circuit and the test sequence generator of the second validation circuit.

The synchronous circuit may be designed by a method which comprises at least the following actions: providing a Register Transfer Level (RTL) description of the synchronous circuit, which includes an RTL description of the one or more validation circuits; determining a set of synchronous circuit constraints and executing a synthesis program on a computer on the basis of the RTL description and the synchronous circuit constraints. The validation circuits generated by the synthesis program may be arranged to verify the portion of the constraints associated with the corresponding functional circuitry during execution time of the synchronous circuitry.

The set of synchronous circuit constraints may comprise a set of functional circuitry constraints and a set of validation circuit constraints and the operation of determining the synchronous circuit constraints may comprise determining the validation circuit constraints on the basis of one or more of the functional circuitry constraints.

FIG. 1 schematically shows an example of a clock signal and a data signal as may be applied at a capture cell. In the example, the data signal is a bi-level signal.

The capture cell may respond to triggering edges, e.g., rising edges, of the clock signal by sampling the data signal. Sampling means memorizing, storing, or latching the current value, e.g., 0 or 1, which is assumed by the data signal at the time of the rising edge of the clock signal (t3 in the example). To this end, the data signal must remain substantially constant during a time interval [t2, t4] comprising the instant t3 of the rising edge. The interval [t2, t3] preceding the rising edge is known as the setup period, setup time, or setup interval. The interval [t3, t4] following the instant t3 of the rising edge is known as the hold period, hold time, or hold interval. In other words, the data signal must remain stationary during the setup time and during the hold time to enable the capture cell to sample the data signal reliably. In the example, this requirement is fulfilled, with the data signal being high, e.g., having the value 1, during an interval [t1, t5] which comprises both the setup interval [t2, t3] and the subsequent hold interval [t3, t4]. In other words, FIG. 1 illustrates an example in which the data signal is correctly timed relative to the clock signal.

Figure 2:
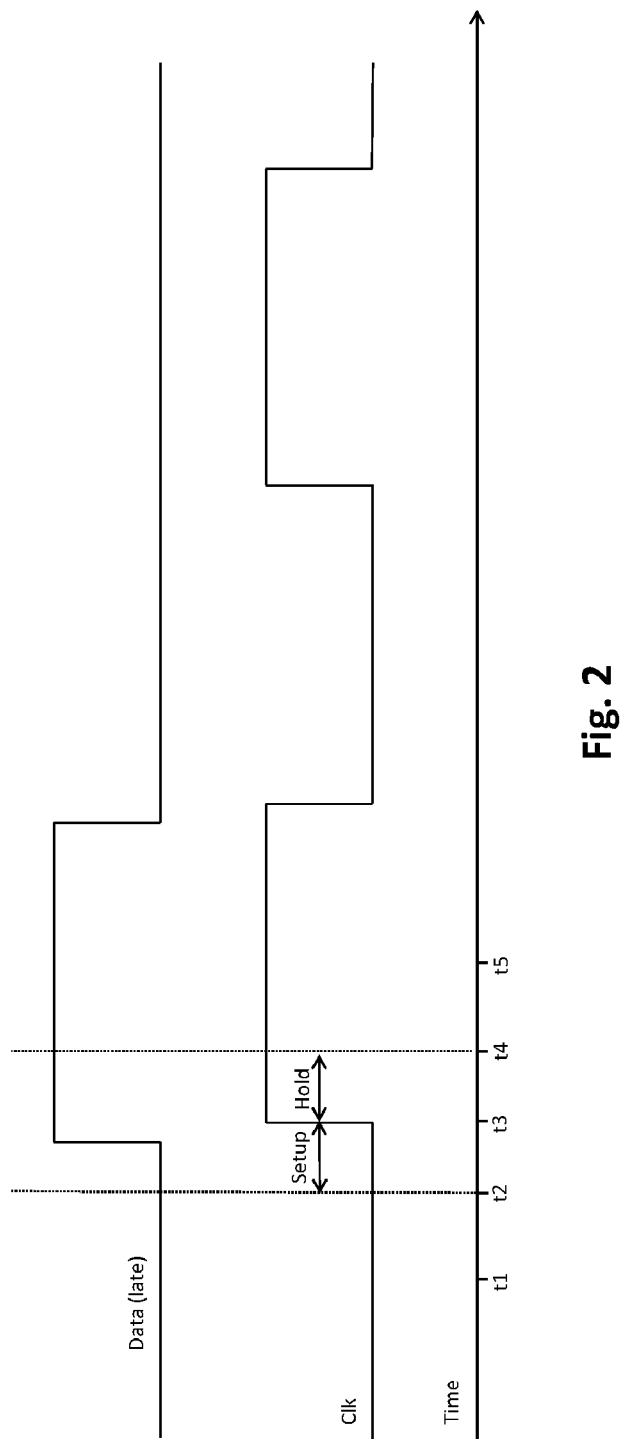
FIG. 2 schematically shows an example of a capture clock signal and a late data signal.

FIG. 2, in contrast, illustrates an example in which the data signal is late with respect to the clock signal. More specifically, the late data signal has a rising edge during the setup interval [t2, t3]. The late data signal thus changes during the setup interval, possibly preventing the capture cell from sampling the data signal correctly. Although the late data signal in this example has the value 1 at the time t3 of the rising edge of the clock signal, there may be a certain probability of the capture cell capturing the value 0 instead of the correct value 1.

Figure 3:
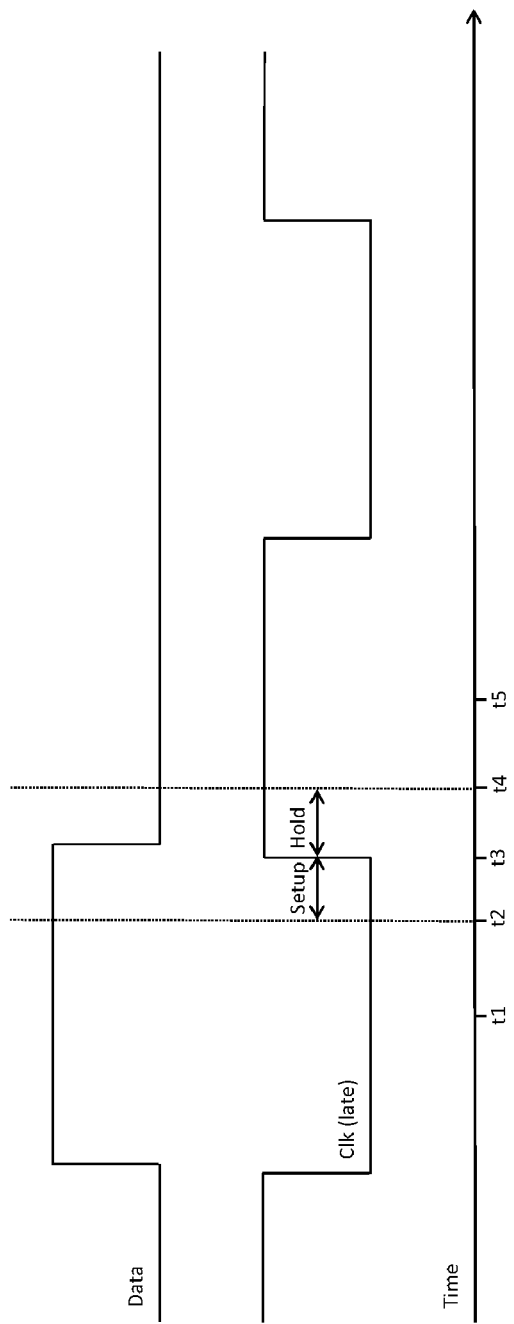
FIG. 3 schematically shows an example of a late capture clock signal and a data signal.

FIG. 3 illustrates an example of a scenario in which the data signal is too early with respect to the clock signal or, equivalently, in which the clock signal is late relative to the data signal. In the example, the data signal passes from 1 to 0 during the hold interval [t3, t4], possibly preventing the capture cell from sampling the data signal correctly.

Figure 4:
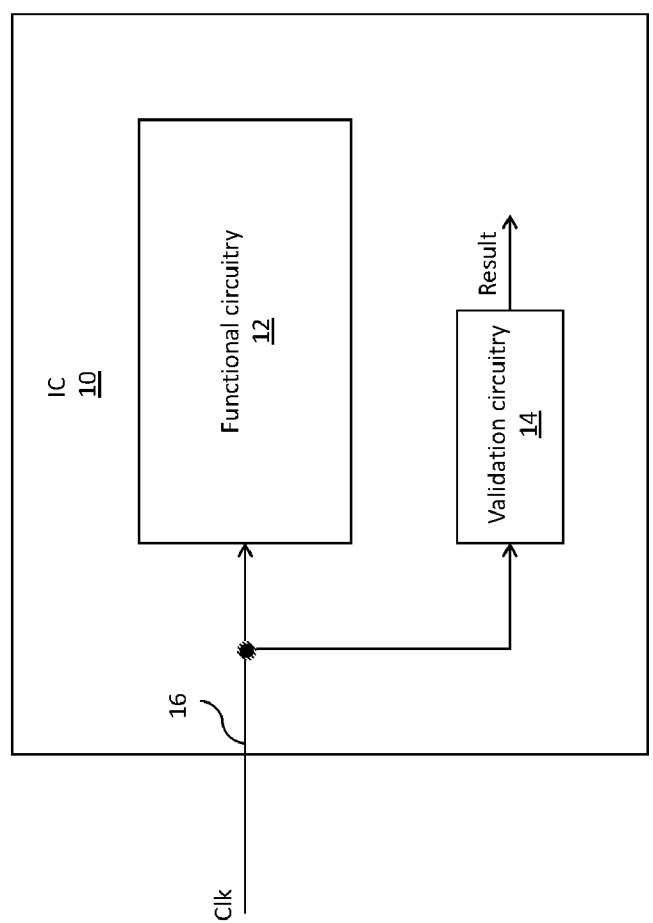
FIG. 4 schematically shows an example of an embodiment of a synchronous circuit.

FIG. 4 schematically illustrates an example of a synchronous circuit 10, e.g., an integrated circuit (IC). The synchronous circuit 10 may comprise functional circuitry 12 which may be clocked by a clock signal Clk. In the example, the clock signal Clk is fed to the synchronous circuit 10 from an external clock. In another example (not shown), the clock signal Clk may be generated by a clock located within the synchronous circuit 10. The functional circuitry 12 may comprise a plurality of cells clocked by the clock signal Clk, or by clock signals generated on the basis of the clock signal Clk. The clock signal Clk may be fed to the individual components via a clock network, e.g., a clock tree. The clock signal Clk at a low level of the clock tree, e.g., at a root of the clock tree, may be referred to as the root clock signal or as the source clock signal. The clock signal Clk at high levels of the clock tree, e.g., at a clock input of a clocked component of the functional circuitry 12, may be referred to differently, considering that the clock signal Clk may experience a substantial delay while propagating through the clock tree.

The synchronous circuit 10 may further comprise validation circuitry 14. The validation circuitry 14 may be arranged to detect whether the functional circuitry 12 satisfies one or more timing conditions which must be met to ensure proper synchronous operation the functional circuitry 14. The clock source may be arranged to clock both the functional circuitry 12 and the validation circuitry 14. A node 16 at which the source clock signal is provided and from which the source clock signal may propagate to the functional circuitry 12 and to the validation circuitry 14 may be referred to as the clock source.

The validation circuitry 14 may comprise one or more validation circuits. Each of the one or more validation circuits may comprise a clock distribution network, a test signal generator, a capture cell, a test signal path from the test signal generator to the capture cell, and a verification unit. The clock distribution network may comprise a part of the clock tree. More specifically, the clock distribution network may be connected to the clock source 16 and be arranged to apply a launch clock signal at the test signal generator and a capture clock signal at the capture cell. The launch clock signal and the capture clock signal may have the same clock rate, which may be a test clock rate. The test clock rate may be a critically high or hypercritically high clock rate. That is, the test clock rate may be as high as or higher than a clock rate applied in the functional circuitry 12.

In each of the one or more validation circuits, the test signal generator may be arranged to output test bits successively in response to triggering edges of the launch clock signal, the test bits forming a test sequence. In other words, the test signal generator may generate a test signal representing a test sequence. Each test bit may be a binary bit and, accordingly, the test sequence may be a binary sequence. For example, the test sequence may be an alternating binary sequence. An alternating binary sequence is a sequence in which the value one is followed by the value zero and the value zero is followed by one. In other words, an alternating binary sequence alternates between the values 0 and 1.

The test signal path may be arranged to transmit the test signal from the test signal generator to the capture cell. The test signal path may notably be a non-clocked test signal path, allowing the test signal to propagate to the capture cell independently of any clock signal. The test signal path may have a signal propagation time which is substantially shorter than one clock period.

The capture cell may be arranged to generate a proof signal representing a proof sequence by sampling the test signal in response to triggering edges of the capture clock signal. The verification unit may be arranged to determine whether the proof sequence is identical to the test sequence. For example, the verification unit may be arranged to generate a verification signal which is indicative of whether or not the proof sequence is identical to the test sequence. For example, the verification unit may be arranged to raise a flag in response to determining that the proof sequence differs from the test sequence. The validation circuitry 14 not flagging any errors may thus indicate that the functional circuitry 12 is synchronized correctly, and in particular that the functional circuitry 12 is not being overclocked.

Figure 5:
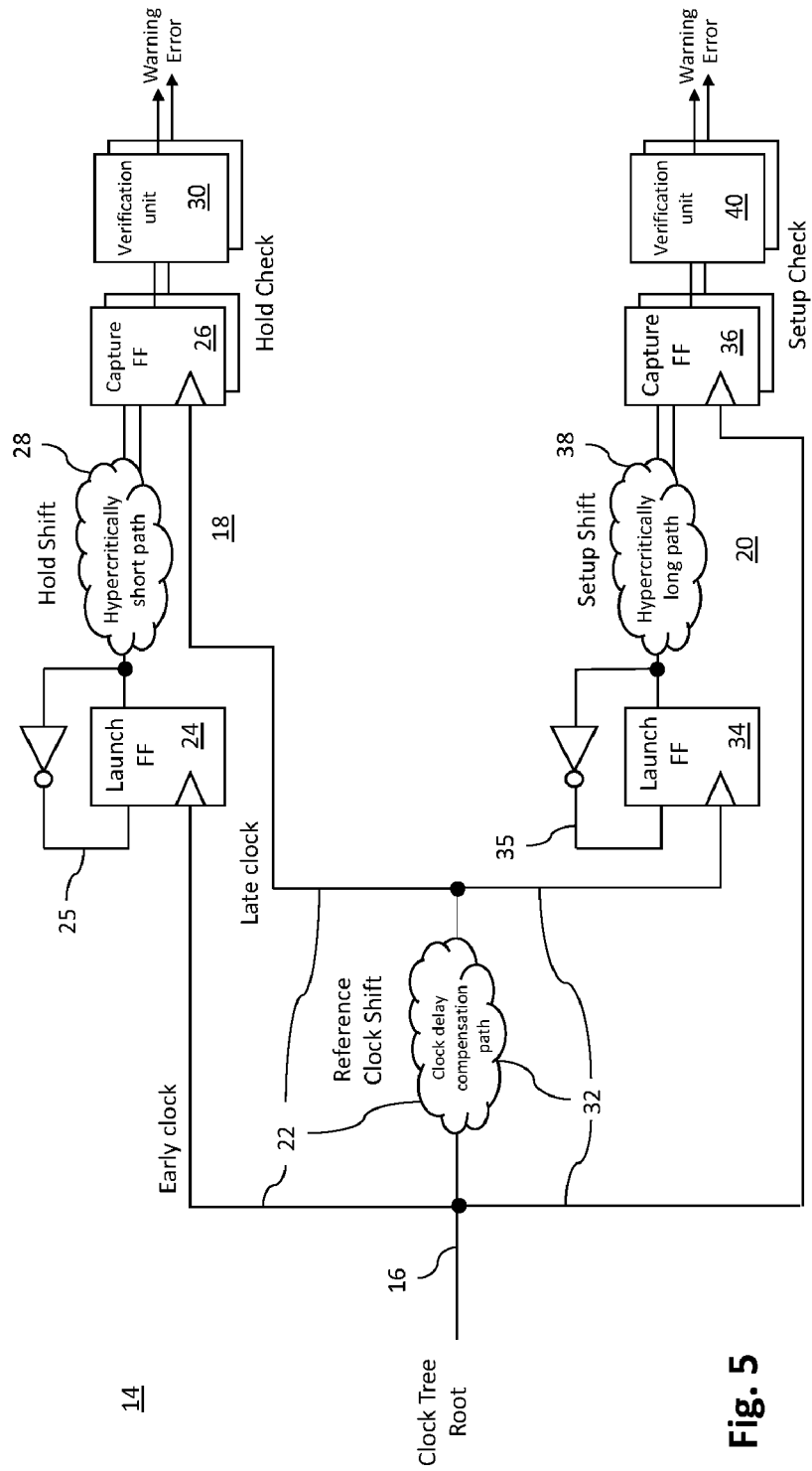
FIG. 5 schematically shows an example of an embodiment of a hold time test circuit and a setup time test circuit.

FIG. 5 schematically shows an example in which the validation circuitry 14 comprises validation circuits 18 and 20, e.g., a hold time test circuit 18 and, e.g., a setup time test circuit 20. The hold time test circuit 18 may comprise a clock distribution network 22, a test signal generator 24, 25, a capture cell 26, a test signal path 28 from the test signal generator 24, 25 to the capture cell 26, and a verification unit 30.

In operation, the clock distribution network 22 may be connected to the clock source 16 and apply a launch clock signal at the test signal generator 24, 25 and a capture clock signal at the capture cell 26, the launch clock signal and the capture clock signal having the same clock rate, which may be a test clock rate. The test signal generator 24, 25 may generate a test signal representing a test sequence in response to triggering edges of the launch clock signal. The test sequence may notably be a binary test sequence, and the test signal may be a bi-level test signal. The test signal path 28 may transmit the test signal from the test signal generator 24, 25 to the capture cell 26. The capture cell 26 may generate a proof sequence by sampling the test signal in response to triggering edges of the capture clock signal. The verification unit 30 may determine whether the proof sequence is identical to the test sequence.

The clock distribution network 22 may be arranged such that the capture clock signal arriving at the capture cell 26 is late relative to the test signal arriving at the capture cell 26. For example, the clock distribution network 22 may have a capture clock signal propagation time which is hypercritically long. Furthermore, the test signal path 28 may have a signal propagation time which is hypercritically short. The capture clock signal propagation time of the clock distribution network 22 and the signal propagation time of the test signal path may be hypercritically long and short, respectively, in the sense that they are longer and shorter, respectively, than any comparable capture clock signal propagation time and any comparable signal propagation time in the functional circuitry 12. In other words, the capture clock delay and the signal propagation time may be hypercritical in the sense that the capture cell 26 experiences a hold time violation more easily than any comparable capture cell in the functional circuitry 12. The proof sequence produced by the capture cell 26 being identical to the test sequence generated by the test signal generator 24, 25 may therefore be a reliable indication that the functional circuitry 12 satisfies the hold time requirement.

Similarly, the setup time test circuit 20 may comprise a clock distribution network 32, a test signal generator 34, 35, a capture cell 36, a test signal path 38 from the test signal generator 34, 35 to the capture cell 36, and a verification unit 40. In the example, the clock distribution network 22 of the hold time test circuit 18 may share circuitry with the clock distribution network 32 of the setup time test circuit 20.

In operation, the clock distribution network 32 may apply a launch clock signal at the test signal generator 34, 35 and a capture clock signal at the capture cell 36, the launch clock signal and the capture clock signal having the same clock rate, which may be a test clock rate. The test signal generator 34, 35 may generate a bi-level test signal representing a binary test sequence in response to triggering edges of the launch clock signal. The test signal path 38 may transmit the test signal from the test signal generator 34, 35 to the capture cell 36. The capture cell 36 may generate a binary proof sequence by sampling the bi-level test signal in response to triggering edges of the capture clock signal. The verification unit 40 may determine whether the proof sequence is identical to the test sequence.

The clock distribution network 32 may have a launch clock signal propagation time which is hypercritically long. Furthermore, the test signal path 38 may have a signal propagation time which may be hypercritically long. In other words, a launch clock signal propagation time of the clock distribution network 32 may be longer than any comparable launch clock signal propagation time in the functional circuitry 12. Similarly, the signal propagation time of the test signal path 38 may be longer than the signal propagation time of any comparable data signal path in the functional circuit 12, e.g., longer than the signal propagation time between any sequentially-adjacent elements in the functional circuit 12.

The hold time test circuit 18 and the setup time test circuit 20 may thus detect hold time violations and setup time violations, respectively.

Figure 6:
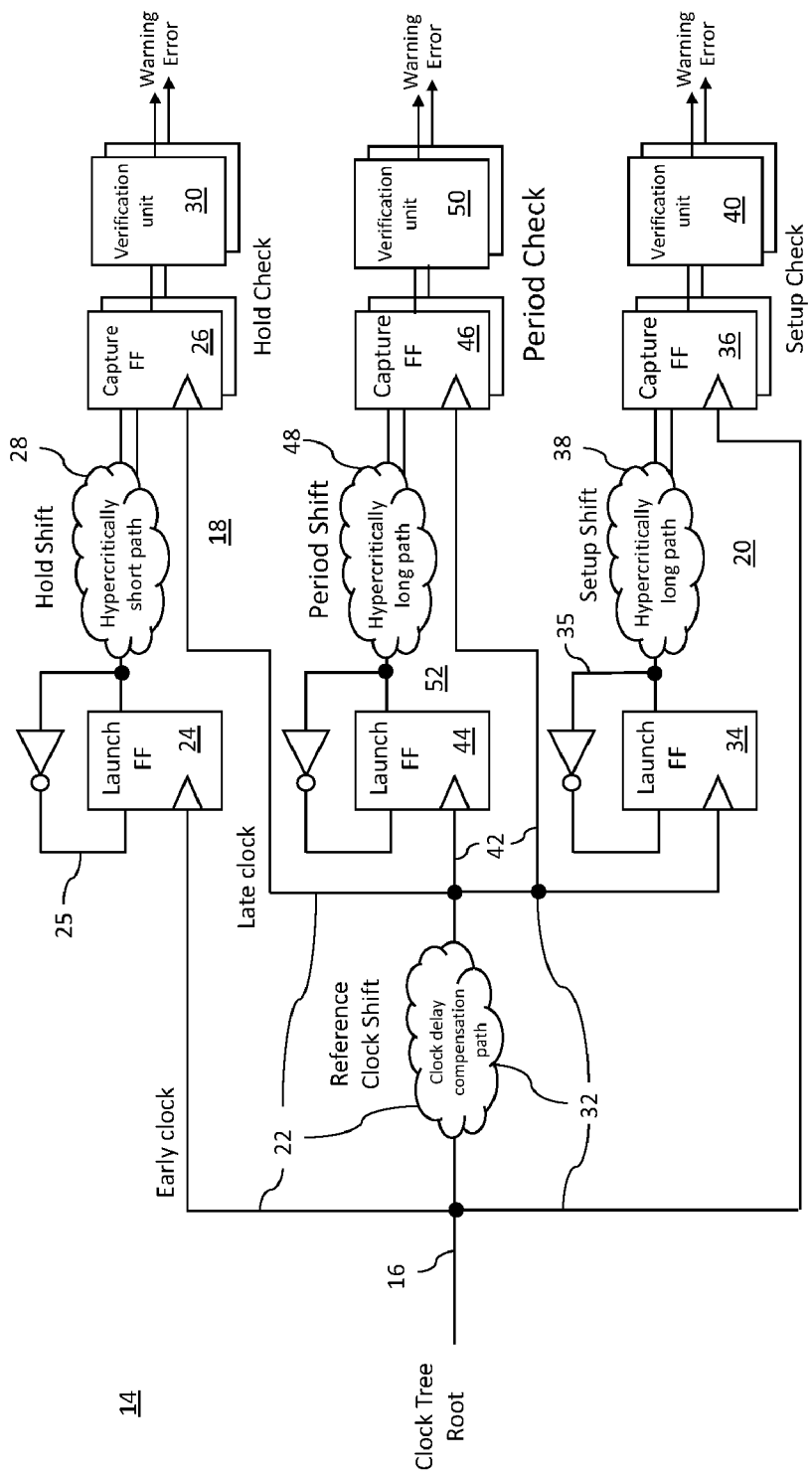
FIG. 6 schematically shows an example of an embodiment of a hold time test circuit, a period test circuit, and a setup time test circuit.

FIG. 6 schematically shows an example in which the validation circuitry 14 additionally comprises a period test circuit 52. The period test circuit 52 may comprise a clock distribution network 42, a test signal generator 44, a capture cell 46, a test signal path 48 from the test signal generator 44 to the capture cell 46, and a verification unit 50. The clock distribution network 42 may be connected to the clock source 16. In operation, the clock distribution network 42 may apply a launch clock signal at the launch clock cell 44 and a capture clock signal at the capture cell 46, the launch clock signal and the capture clock signal having the same clock rate, which may be a test clock rate. The test signal generator 44 may generate a bi-level test signal representing a binary test sequence in response to triggering edges of the launch clock signal. The test signal path 48 may transmit the test signal from the test signal generator 44 to the capture cell 46. The capture cell 46 may generate a binary proof sequence by sampling the bi-level test signal in response to triggering edges of the capture clock signal. The verification unit 50 may determine whether the proof sequence is identical to the test sequence. The test signal path 48 may have a signal propagation time which may be hypercritically long while the clock distribution network 42 may be arranged such that the launch clock signal at the test signal generator 44 and the capture clock signal at the capture cell 46 have a clock skew relative to each other which is substantially zero.

Figure 7:
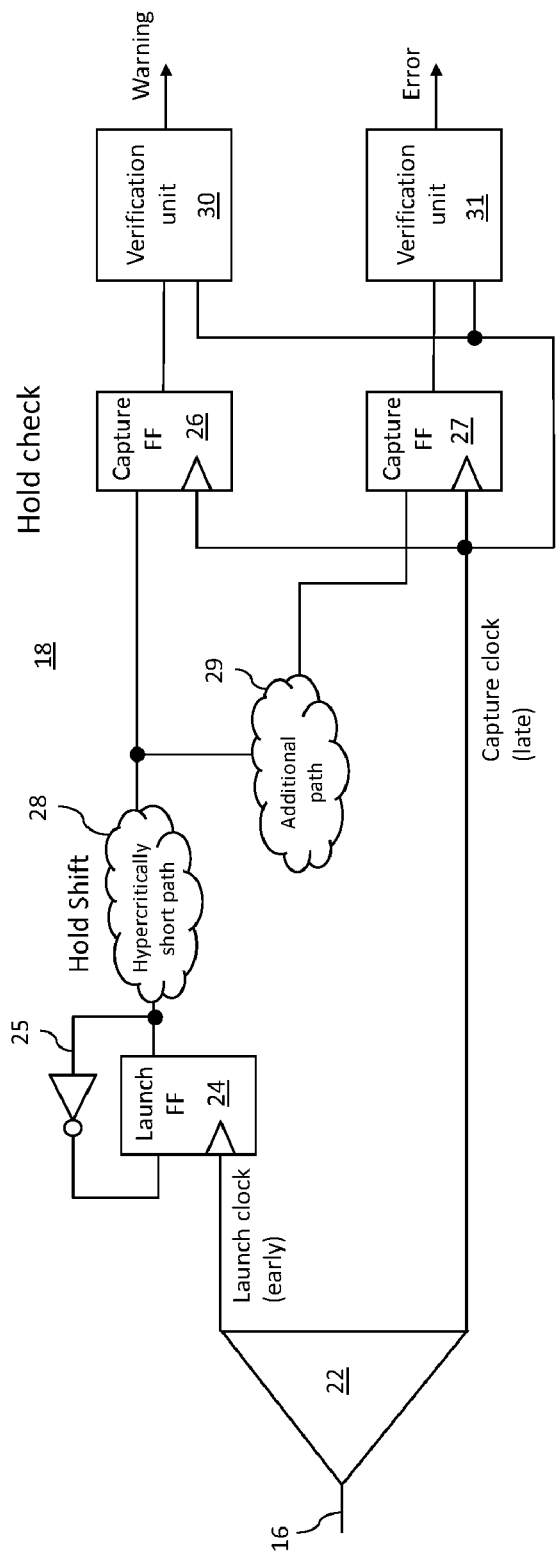
FIG. 7 schematically shows an example of an embodiment of a hold time test circuit.

In the example of FIG. 7, the test signal generator 24, 25 of the hold time test circuit 18 comprises a launch cell 24 and a feedback loop 25. The feedback loop 25 may connect a data output of the launch cell 24 back to a data input of the launch cell 24. In the example, the data input and the data output of the launch cell 24 are both non-inverting and the feedback loop 25 is inverting. Accordingly, with every triggering clock edge, e.g., with every rising clock edge, the state of the launch cell is inverted. The launch cell 24 may thus be arranged to generate an alternating sequence of test bits as a test sequence.

The hold time test circuit 18 may further comprise, in addition to the capture cell 26 (first capture cell), a second capture cell 27. The capture cells 26 and 27 may be connected similarly with respect to the clock distribution network 22 and the launch cell 24. Accordingly, the second capture cell 27 may have a data input connected to the data output of the launch cell 24 via a second test signal path 28, 29. The second test signal path 28, 29 may have a longer signal propagation time than the first test signal path 28. In the example, the second test signal path 28, 29 comprises a first section which is also part of the first test signal path 28 and a second section 29 which is a branch-off from the first test signal path 28. The second test signal path 28, 29 may therefore be less critically short than the first test signal path 28. Therefore, when the first capture cell 26 produces a proof sequence which differs from the test sequence produced by the launch cell 24, the second capture cell 27 may still sample the test sequence correctly and produce a proof sequence which is identical to the test sequence. The first capture cell 26 and the second capture cell 27 may therefore serve for generating a hold time warning and a hold time error signal, respectively.

Figure 8:
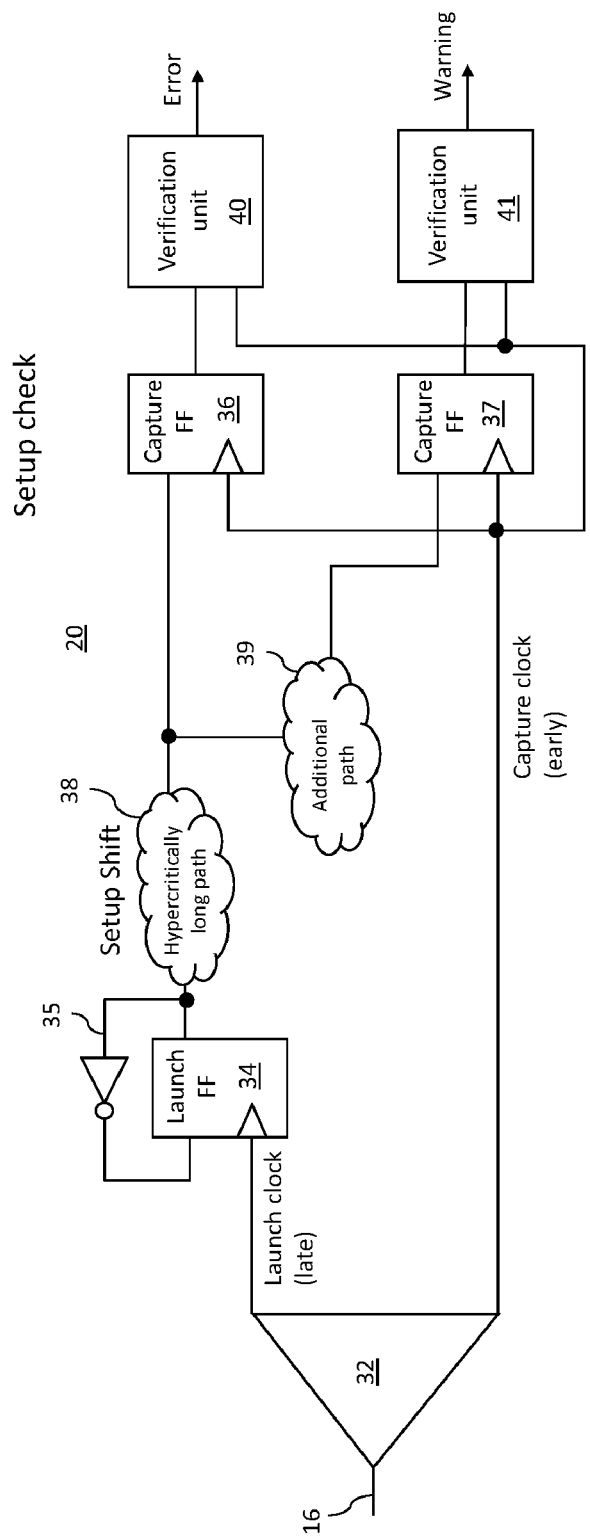
FIG. 8 schematically shows an example of an embodiment of a setup time test circuit.

In the example of FIG. 8, the test signal generator 34, 35 of the setup time test circuit 20 comprises a launch cell 34 and a feedback loop 35 connecting a data output of the launch cell 34 back to a data input of the launch cell 34. The feedback loop 35 may be inverting so as to prompt the launch cell 34 to generate an alternating binary sequence. The launch cell 34 and the feedback loop 35 may be designed in the same or similar manner as the launch cell 24 and the feedback loop 25 of the hold time test circuit 18 described above in reference to FIG. 7.

The setup time test circuit may further comprise a second capture cell 37 in addition to the first capture cell 36. The second capture cell 37 may be connected to the launch cell 34 via a second test signal path 38, 39 which may have a longer signal propagation time than the first test signal path 38 connecting the launch cell 34 to the capture cell 36. The general layout of the setup time test circuit 20 may be identical to the hold time test circuit 18, the only differences consisting in the phase shift between the launch clock signal and the capture clock signal, and in the signal propagation times of the test signal paths 28, 29, 38, and 39. Notably, the second test signal path 38, 39 of the setup time test circuit 20 may have a longer signal propagation time than the first test signal path 38. The second capture cell 37 may therefore produce a proof sequence differing from the test sequence under conditions in which the first capture cell 36 still produces a proof sequence identical to the test sequence. The first capture cell 36 and the second capture cell 37 may therefore serve for generating a setup time error signal and a setup time warning, respectively.

The features described above with reference to FIGS. 5 to 8 can be adapted to any of the validation circuits of the validation circuitry 14. Notably, any of the validation circuits may comprise a feedback loop from a state output of a launch cell of the respective test signal generator to a state input of the launch cell, thereby defining the test sequence. Each of the launch clock cell and the capture clock cell may, for example, be a D flip-flop.

Figure 9B:
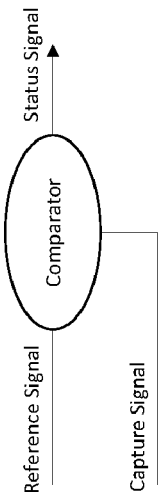
FIG. 9B schematically shows an example of another embodiment of a verification unit.

As illustrated in the example of FIG. 9B, each verification unit, e.g., each of the verification units 30, 31, 40, 41 and 50, may be implemented, for example, as a comparator. The comparator may, for instance, have a first input, a second input, and a comparator output. The first input may be connected, e.g., to the test signal generator so as to receive the test signal from the test signal generator. The second input may be connected to the capture cell so as to receive the proof signal from the capture cell. The comparator output may be arranged to generate an output signal which indicates whether or not the level at the first input is identical to the level at the second input. In this example, the verification unit receives the output of the launch cell as additional input.

Figure 9A:
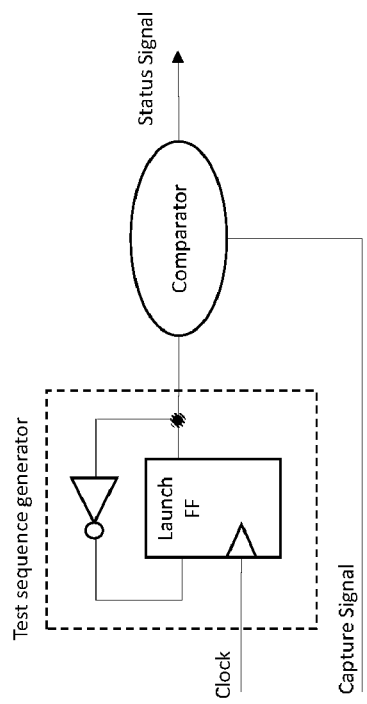
FIG. 9A schematically shows an example of an embodiment of a verification unit.

In another example, illustrated in FIG. 9A, the comparator has its first input connected to an independent test sequence generator (not shown). The independent test sequence generator may have its clock input connected to the clock distribution network 22 so as to receive the capture clock signal from the clock distribution network 22, e.g., as schematically illustrated by FIGS. 7 and 8. In this embodiment, the verification unit does not use the original test sequence but generates its own test sequence with an equivalent test generator clocked by an equivalent clock signal to trigger generation of a new test bit. This example configuration is used in FIGS. 7 and 8, as can be seen by the connecting line from the verification unit to the capture clock signal.

The test sequence may be an alternating sequence. This may facilitate comparing the proof sequence and the test sequence. The verification unit of any of the validation circuits may, for example, be arranged to determine, for each bit of the respective proof sequence, whether the bit in question is the inverse of the preceding bit of the proof sequence. A difference between the proof sequence and the test sequence can thus be detected within a single clock cycle.

The one or more validation circuits may include a first validation circuit and a second validation circuit similar to the first validation circuit, wherein the first validation circuit has a first timing violation detection threshold and the second validation circuit has a second timing violation detection threshold different from the first timing violation detection threshold. The first validation circuit and the second validation circuit may be similar in the sense that they detect the same type of timing errors, but with different tolerances. In each of the examples of FIGS. 7 and 8, a first validation circuit and a second validation circuit are integrated in a single validation circuit, the first validation circuit and the second validation circuit comprising shared circuitry. Notably, the test sequence generator may be shared among the first validation circuit and the second validation circuit. For example, the second timing violation detection may be lower than the first timing violation detection threshold. In this case, the second validation circuit may be more sensitive in detecting timing violations than the first validation circuit. The first validation circuit and the second validation circuit may thus be operated to generate error signals and warnings, respectively.

Each of the test signal paths mentioned herein may comprise or consist of one or more combinatorial logic cells. Combinational logic, also referred to as time-independent logic, is a type of digital logic which is implemented by Boolean circuits, where the output is a pure function of the present input only. This is in contrast to sequential logic, in which the output depends not only on the present input but also on the history of the input. In other words, sequential logic has memory while combinational logic has not. For example, flip-flops and latches are sequential logic cells, whereas buffers, inverters, AND gates, OR gates, NOR gates, XOR gates, multiplexers, and any combinations of these cells, e.g., adders, AND-OR gates, and OR-AND gates, are examples of combinatorial logic cells. A register transfer level (RTL) description of a synchronous circuit may be implemented by sequential logic cells for capturing state information. These may be connected by combinatorial logic cells that implement a logic function. The test signal paths may be among the connections implemented by combinatorial cells.

Figure 10:
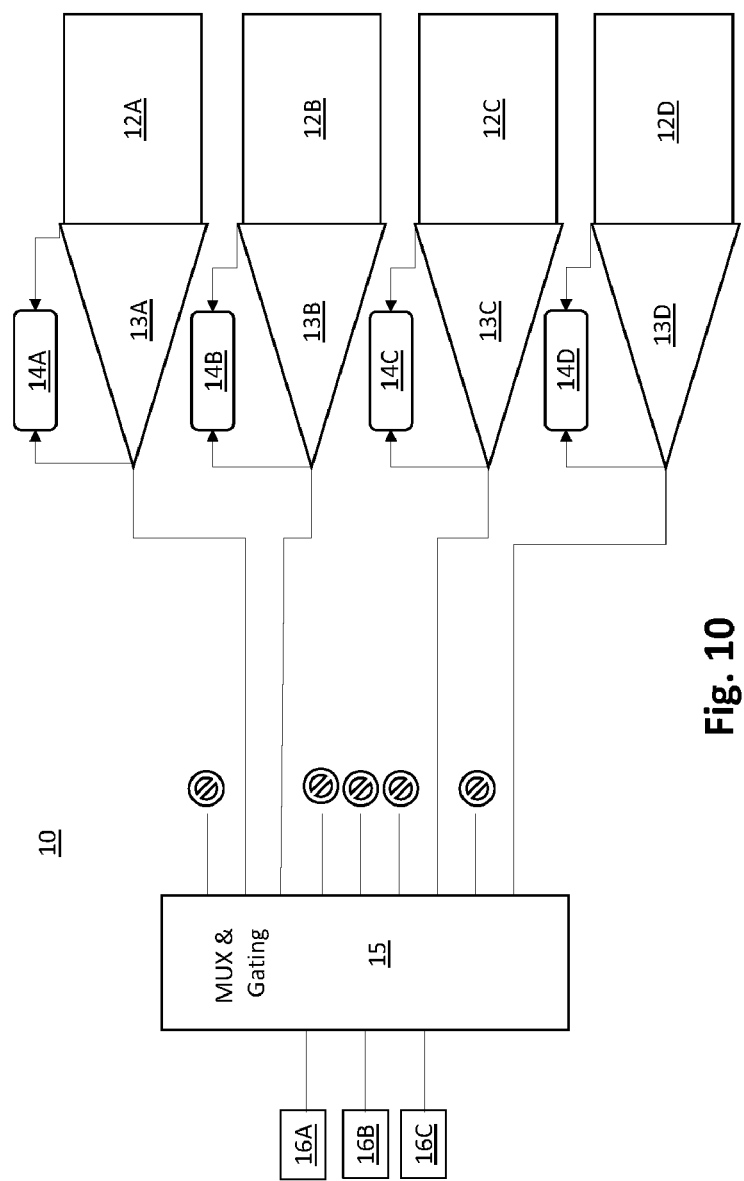
FIG. 10 schematically shows an example of a synchronous circuit comprising several clock trees.

In the example of FIG. 10, the functional circuitry 12 (see FIG. 4) of the synchronous circuit 10 comprises one or more functional units, e.g., four functional units 12A to 12D. Each of these functional units may have its own clock tree 13A, 13B, 13C, and 13D, respectively, with a clock input (referred to herein as a clock root) connected or connectable to a clock source and a set of one or more outputs connected to the respective functional unit. Each of the functional units 12A to 12D may thus be clocked via its own clock tree. The synchronous circuit may comprise one or more clock sources. In the example, the synchronous circuit 10 comprises three clock sources 16A, 16B, and 16C, and a clock routing network 15, e.g., a clock multiplexing and gating network that generates the clock signal for every clock tree 13A, to 13D respectively. The clock routing network 15 may be operated to connect any of the clock trees 14A to 14D to any clock source among the clock sources 16A to 16C. Furthermore, the clock routing network 15 may be operated to connect to further clock trees (not shown) that are not checked by a validation unit. Clock trees which are not checked by a validation circuit are illustrated in the example by stop-signs at the corresponding outputs of the clock routing network.

Each of the functional units 12A to 12D may have a corresponding validation unit 14A, 14B, 14C, and 14D associated with it. Each of the validation units 14A to 14D may be arranged to receive a first and a second clock signal from the respective clock tree 13A, 13B, 13C, or 13D. The first and the second clock signal may be referred to as an early and a late clock signal, respectively. The late clock signal may be retarded relative to the early clock signal by a time substantially shorter than one clock period. The early clock signal may serve, for example, as the launch clock signal for the test signal generator 24, 25 of the hold time test circuit 18 (see FIG. 5), or as the capture clock signal for the capture cell 36 of the setup time test circuit 20 (see FIG. 5), or both. Similarly, the late clock signal may serve, for example, as the capture clock signal for the capture cell 26 of the hold time test circuit 18 (see FIG. 5), or as the launch clock signal for the test signal generator 34, 35 of the setup time test circuit 20 (see FIG. 5), or both.

Figure 11:
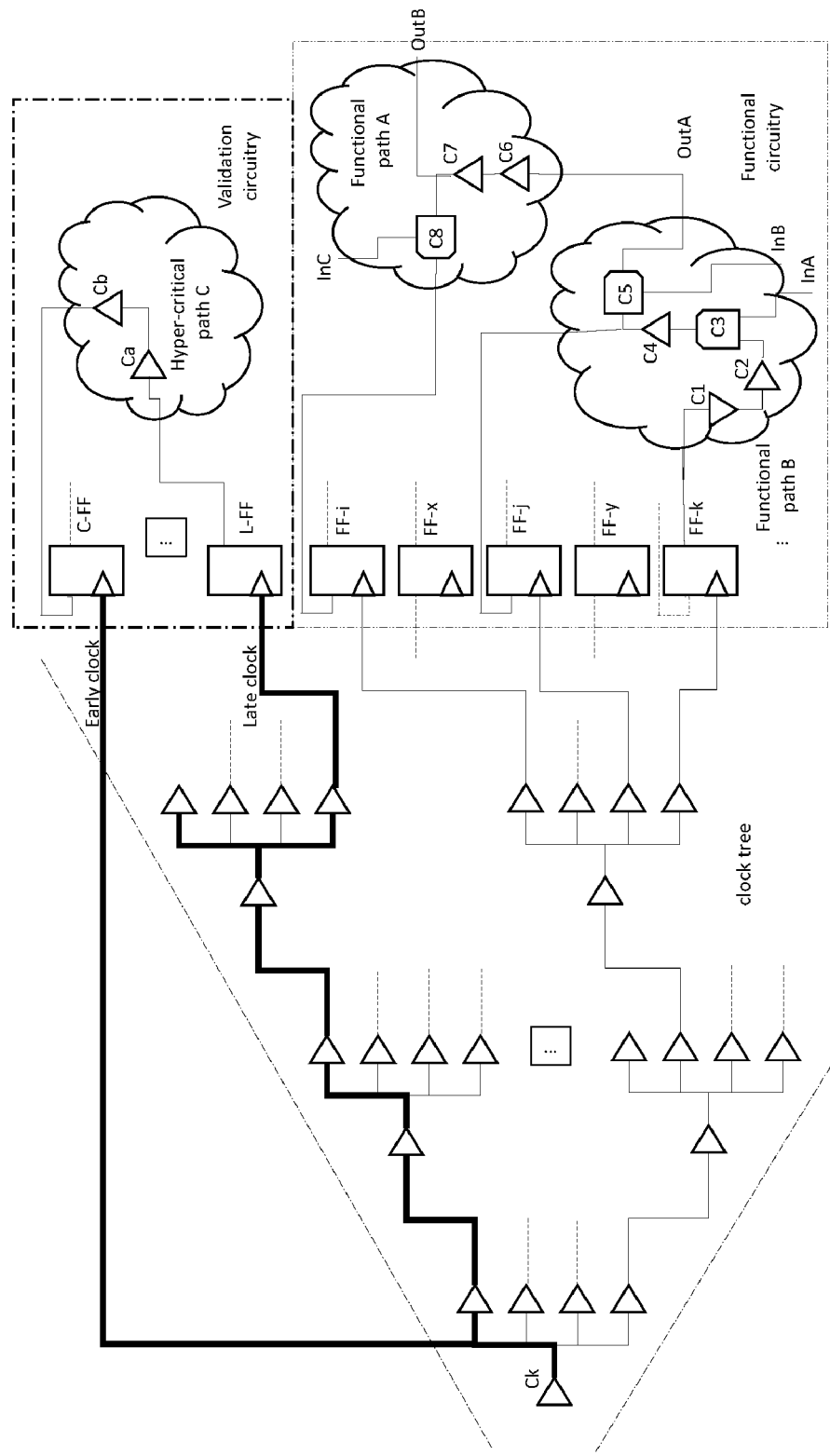
FIG. 11 schematically illustrates an example of an embodiment of a synchronous circuit.

FIG. 11 schematically illustrates an example including functional circuitry (e.g., one of the functional units 12A to 12D, e.g., the functional unit 12A), an associated clock tree (e.g., one of the clock trees 13A to 13D, e.g., the clock tree 13A), and an associated validation unit (e.g., one of the validation units 14A to 14D, e.g., the validation unit 14A).

The functional circuitry may contain a set of sequential cells, e.g., flip-flops FF-i, FF-j, FF-k, FF-x, FF-y), and a set of combinatorial cells connecting these sequential cells in the form of functional paths. The example of FIG. 11 illustrates two examples of functional paths; a first functional path B which connects the output of the sequential cell FF-k with the input of the sequential cell FF-j via combinatorial cells C1, C2, C3, and C4; an additional input to these logic cells may be provided from another source (not shown) via an input InA. The result of the thus implemented logic function may be provided to another sink (not shown) via an output OutA; possibly taking additional inputs into account (e.g., an input InB) and also possibly using additional combinatorial logic (e.g., a combinatorial cell C5). The output of a functional path may act as input to another functional path, e.g., as illustrated by the output OutA of the Functional Path B in this example. Subsequently, a functional path connecting two sequential cells may be formed by combining one or more functional paths, e.g., as illustrated by the connection of the output of the sequential cell FF-k with the input of the sequential cell FF-l, e.g., via the combinatorial cells C1 to C8, and may have several additional inputs that are provided from other sources (e.g., as shown with the inputs InA to InC) and may provide data to other functional paths via outputs (e.g., as shown with the outputs OutA to OutB). The functional circuitry may contain large amounts of additional elements, which is schematically illustrated, as an example, by the further sequential cells FF-x and FF-y and their corresponding functional paths (not shown); there may be several thousands of such elements. EDA tools for generating the functional circuits (e.g., synthesis tools) may ensure that the implemented logic adheres to the defined constraints. In particular, it may ensure that every functional path between two sequential elements meets the setup and hold time requirements, as they are formulated by the provided constraints. One important aspect of this is the appropriate balancing of the clock signals derived from the clock tree root, e.g., as illustrated by the combinatorial element Ck, which may use multiple levels of combinatorial elements to ensure that a single combinatorial element does not have to drive more than the maximum permitted amount of other cells (which is a limit that is usually imposed by the type of semiconductor technology that is used).

FIG. 11 also relates to an example of a method of supplementing the validation circuitry and its clock tree with validation circuitry. Each of the functional circuitry and the validation circuitry may comprise one or more sequential cells. For instance, the validation circuitry may comprise one or more launch cells and one or more capture cells. Each launch cell and each capture cell may comprise or consist of a flip-flop (FF), for example. The validation circuitry may be implemented such that each of its sequential cells has its clock input operably coupled to a suitable clock, which may be either an early clock or a late clock, e.g., as illustrated in FIG. 6. A clock input that is to be connected to the early clock may be driven, for example, by a combinatorial cell that is, e.g., either the clock tree root Ck or a cell driven by this cell, e.g., in a case in which technology limitations require additional buffering to overcome drive limitations. In contrast to this, a clock input of the validation unit that is to be connected to the late clock may be driven by the balanced outputs of the clock tree, in a manner which may be similar to that of driving sequential cells of the corresponding functional circuitry. Furthermore, the method may ensure the creation of a hyper-critical path. This is illustrated, by way of an example, for the test signal path from a launch FF (L-FF) to a capture FF (C-FF) via, e.g., the combinatorial cells Ca and Cb. This test signal path may comprise or consist of combinatorial cells, e.g., buffers and inverters. The number and type of these cells together with their physical implementation ensures an appropriate delay that exceeds the setup margin, the hold margin, or the period check margin of the functional circuitry, but is smaller than a specified error or warning margin as dictated by the corresponding constraints. Furthermore, creation of the test signal path as part of the same synthesis process that is also used for the functional circuitry may ensure that the formation of this path is consistent with the formation of the other functional paths. The test signal path may therefore be used to cross-check the constraints used for their generation.

As mentioned above, the clock distribution network of the validation unit may be integrated in, or share circuitry with, the clock tree of the functional circuitry. Apart from this, the validation circuitry may be separate and independent from the functional circuitry. However, output from the validation circuitry, e.g., an error output or a warning output or both, may be input to the functional circuitry. For instance, the functional circuitry may be arranged to flag an error condition or a warning condition, or to trigger a functional reaction, in dependence of the output from the validation circuitry.

Figure 12:
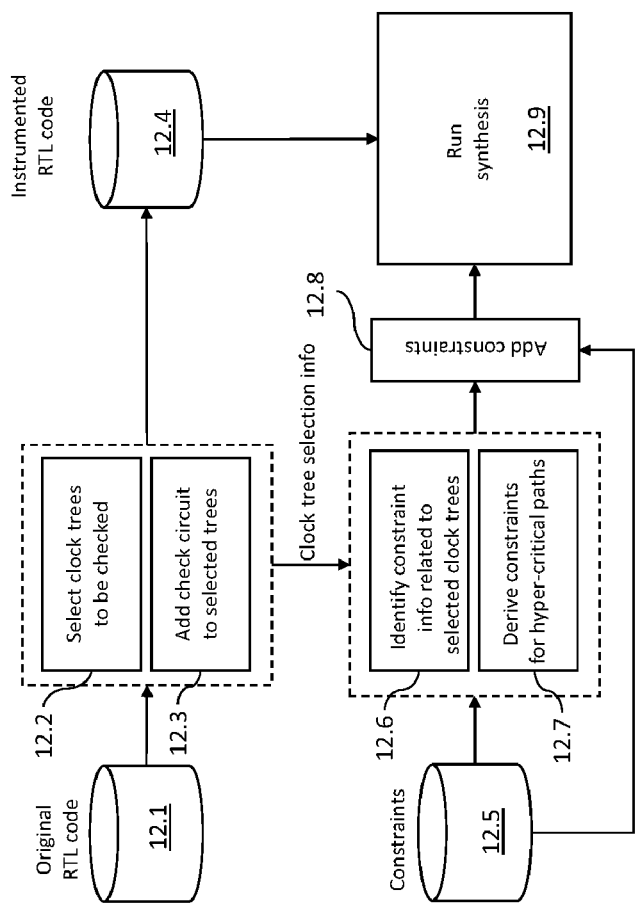
FIG. 12 shows a flowchart of an example of an embodiment of designing a synchronous circuit.

Referring now to FIG. 12, an example of a method of designing a synchronous circuit comprising one or more validation circuits is schematically illustrated. The synchronous circuit may, for example, be a synchronous circuit as described above with reference to FIG. 4, e.g., an IC. The method may comprise providing an RTL description of the synchronous circuit, including an RTL description of the one or more validation circuits; determining a set of synchronous circuit constraints; and executing a synthesis program on a computer on the basis of the RTL description and the synchronous circuit constraints. The set of synchronous circuit constraints may notably include timing constraints of the functional circuitry. The set of synchronous circuit constraints may comprise a set of functional circuitry constraints and a set of validation circuitry constraints. The above mentioned operation of determining the synchronous circuit constraints may comprise determining the validation circuit constraints on the basis of one or more of the functional circuitry constraints.

In the example, an original RTL code describing the functional circuitry 12 but not necessarily the validation circuitry 14 may be provided (12.1). One or more clock trees in the synchronous circuit which are to be validated may then be selected (12.2). An RTL code of the one or more validation circuits for the selected clock trees may be added to the original RTL code (12.3), resulting in an instrumented RTL code, e.g., an RTL description of the synchronous circuit including the validation circuitry (12.4). Furthermore, constraints for both the functional circuitry 12 and the validation circuitry 14 may be provided (12.5), e.g., as follows. Using clock tree selection information, that is, information identifying the one or more selected clock trees, constraint information relating to the one or more selected clock trees may be identified (12.6) from the original constraint information. Constraints for the hypercritical paths of the validation circuitry 14 may then be derived (12.7) from the constraint information related to the selected clock trees. These constraints may be added to the constraints determined in operation 12.5 to generate a complete set of constraints for the synchronous circuit 10 (12.8). A synthesis program may then be executed (12.9) on the basis of the complete set of constraints and on the basis of the instrumented RTL code.

Figure 13:
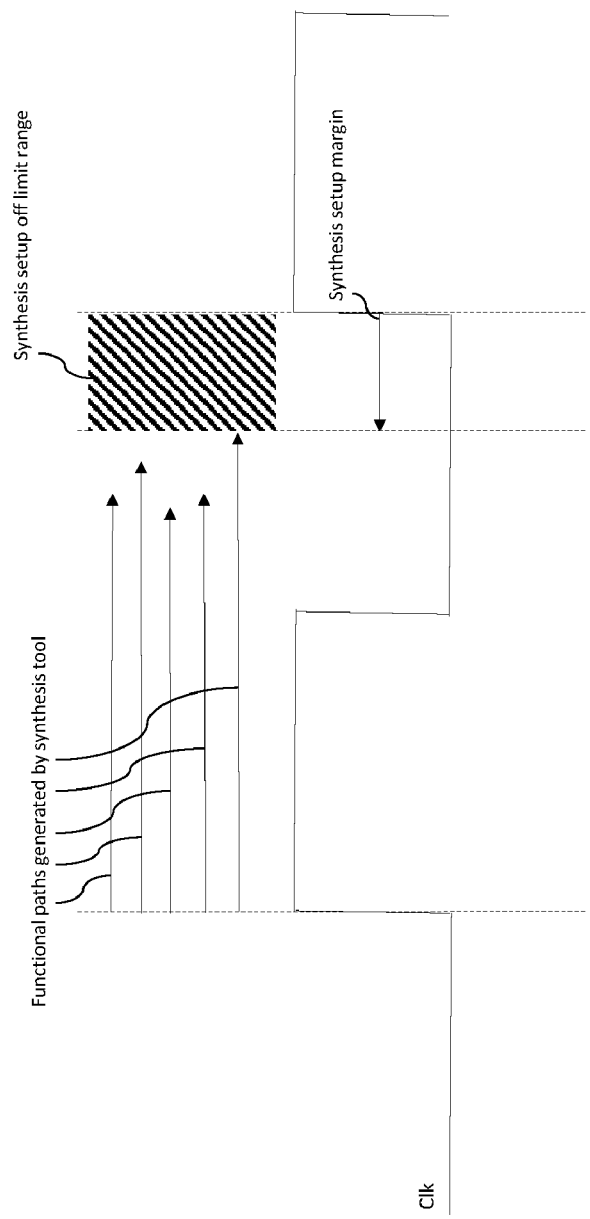
FIG. 13 schematically illustrates an example of a clock signal along with a set of timing parameters.

FIG. 13 schematically illustrates an example of a method of controlling a synthesis process for generating a layout, e.g., a description or model, of the synchronous circuit 10. The layout may then be used for fabricating the synchronous circuit 10. In the figure, the setup time for a clock of a functional circuit is used as an example. Before a synthesis run, a minimum required setup margin "Synthesis Setup Margin" for the corresponding clock tree may be specified, e.g., in terms of one or more constraints, e.g., by specifying a minimum setup time or a percentage of a maximum permitted clock frequency. The constraints can be formulated, for example, in dependence of parameters such as temperature or supply voltage. A synthesis tool may be arranged to ensure that every functional path in the functional circuitry to be generated has a signal propagation time which does not exceed a certain maximum allowed signal propagation time. The maximum allowed signal propagation time may not exceed a full clock period. These functional paths may be designed, for example, such that no signal transition triggered by a previous clock edge may occur within the "Synthesis setup off limit range" between the next clock edge and the "Synthesis Setup Margin". It may thus be ensured that all functional paths may have signal transitions only before the minimum required setup margin specified by the "Synthesis Setup Margin".

Figure 14:
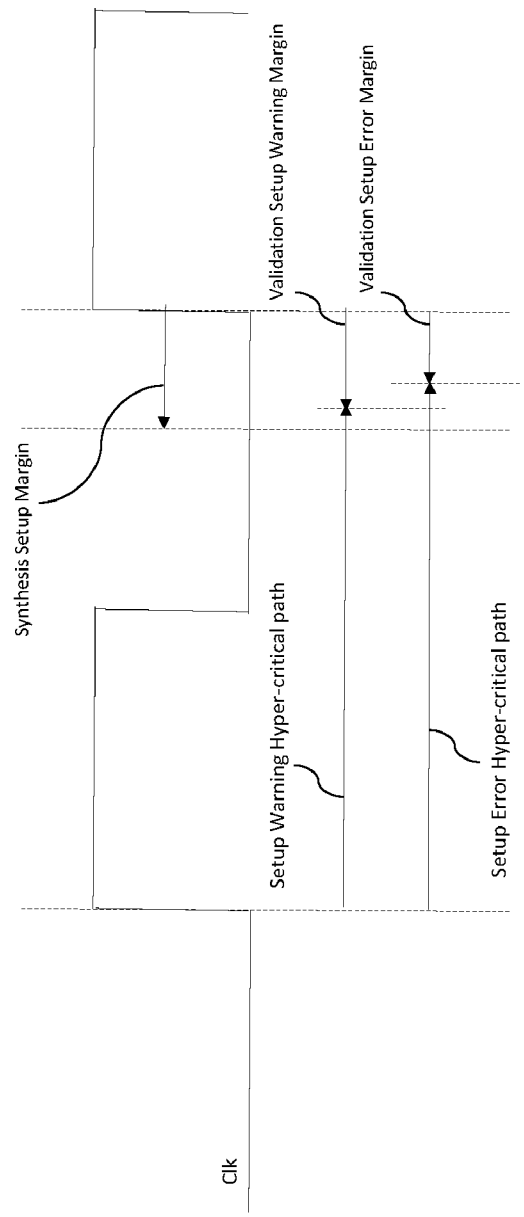
FIG. 14 schematically illustrates an example of a method of designing a setup time test circuit.

FIG. 14 schematically illustrates an example of a method of generating a layout of the setup time test circuit 18 by means of a synthesis tool. In this example, one or more original constraints, e.g., the constraints described above in reference to FIG. 13 for creating the functional paths for the functional circuitry 12, may be copied and modified, e.g. by reducing the minimum setup time or by changing the percentage of the maximum permitted clock frequency. The modified constraints may be applied to the one or more hypercritical paths, but not to any data paths of the functional circuitry 12. Using less severe modifications for the creation of an error path "Setup Error Hypercritical path" and more severe modifications for the creation of a warning path "Setup Warning Hypercritical path", a staged response on error conditions may be implemented. The corresponding paths may be generated by a synthesis tool in one run, e.g., with the same remaining context and, e.g., in parallel with the creation of the functional paths for the functional circuit.

Figure 15:
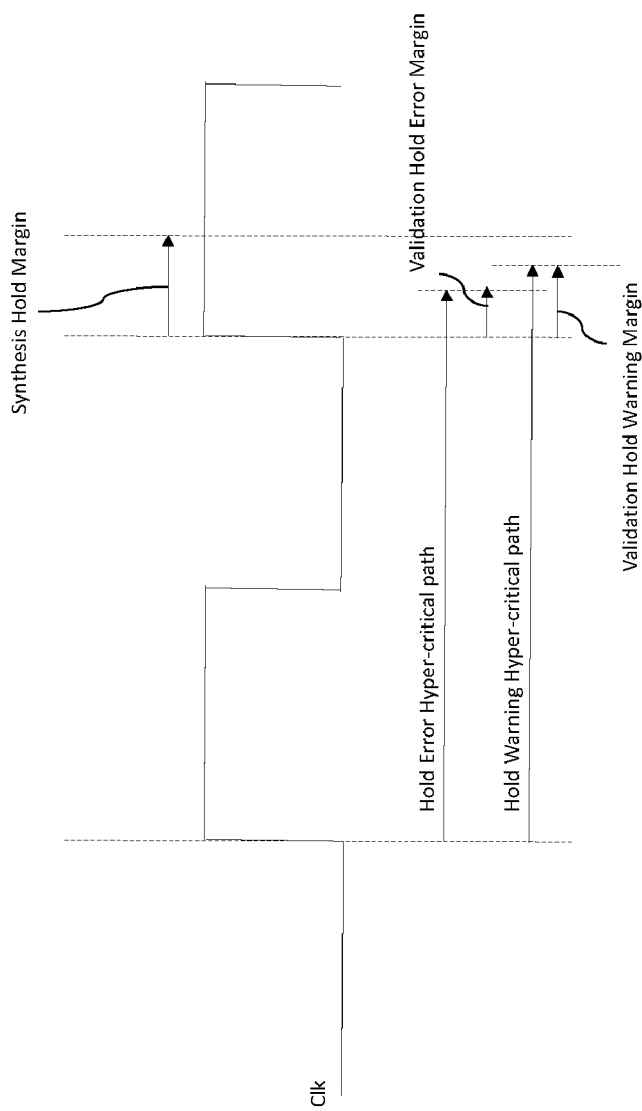
FIG. 15 schematically illustrates an example of a method of designing a hold time test circuit.

FIG. 15 schematically illustrates an example of a method of generating a layout of the hold time test circuit 20, which may be analogous to the considerations described above in reference to FIG. 14. One or more original constraints, e.g., the one or more "Synthesis Hold Margin" constraints, used for creating functional paths of the functional circuit may be copied and modified, e.g., by reducing the minimum hold time, or by changing the percentage of the maximum permitted clock frequency, and be applied to one or more previously inserted hypercritical paths. Using more severely modified constraints for the creation of a warning path "Hold Warning Hypercritical path" and less severely modified constraints for the creation of an error path "Hold Error Hypercritical path", a staged response on error conditions may be achieved. The hypercritical paths may be implemented in a single run of a synthesis tool with the same remaining context and in parallel with the creation of the functional paths for the functional circuit.

The above-described technical measures are closely related to the specific hardware implementation of the synchronous circuit. Preferably, they are directly driven from the constraints driving the implementation. It may thus be ensured during the runtime of the fabricated semiconductor device that the constraints prescribed for the physical implementation are correct and are properly met. The validation circuitry may be enabled continuously or permanently to quickly detect the above described types of failures. It does not rely on programming specific and potentially incorrect parameters into a check element. Choosing appropriate limits that identify a need for an immediate response, e.g., an error condition, or that may be corrected by software, e.g., a warning condition, may provide further flexibility for adjusting the validation method.

This implementation technique requires only such logic elements that belong to a standard cell library. A standard cell library is a library of logic cells that are standard and use only standard connectivity and are simple enough to be used by a synthesis program. As such, a standard cell library comprises a standard set of cells provided to a synthesis program for specifying a physical implementation on the basis of an RTL representation without further manual interaction. These cells may be simple building blocks, such as buffers, inverters, any combinations of AND, OR, and INVERT functionalities, multiplexers, flip-flops and latches, and adders of a limited size. This is in contrast to more complex analog blocks, or specific delay cells that require calibration and/or trimming and may need to be processed or integrated in a specific manner to ensure the correct functionality of those building blocks.

The invention may also be implemented in a computer program for running on a computer system, at least including code portions for performing steps of a method according to the invention when run on a programmable apparatus, such as a computer system or enabling a programmable apparatus to perform functions of a device or system according to the invention.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on computer readable storage medium or transmitted to the computer system via a computer readable transmission medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; non-volatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit (IC) or within a same device. For example, the functional circuitry 12 and the validation circuitry 14 may be located in a single IC. Alternatively, the examples may be implemented as any number of separate integrated circuits or separate devices interconnected with each other in a suitable manner. For example, the validation circuitry 14 may be implemented in a separate IC, and both ICs may be connectable to the same clock source.

Also for example, the examples, or portions thereof, may be implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A synchronous circuit comprising:
   a clock source;
   functional circuitry coupled to the clock source so as to be clocked by the clock source; and
   one or more validation circuits coupled to the clock source so as to be clocked by the clock source, the one or more validation circuits to validate synchronization of the functional circuitry, each of the one or more validation circuits including:
      a clock distribution network coupled to the clock source to provide a launch clock signal and a capture clock signal, the launch clock signal having a clock rate and the capture clock signal having the same clock rate;
      a test signal generator coupled to the clock distribution network to receive the launch clock signal and to produce a bi-level test signal based on trigger edges of the launch clock signal, the bi-level test signal representing a binary test sequence;
      a capture cell coupled to the clock distribution network and the test signal generator to receive the capture clock signal, to receive the bi-level test signal from the test signal generator, and to sample the bi-level test signal based on triggering edges of the capture clock signal to generate a proof sequence;
      a verification unit coupled to the capture cell to receive the proof sequence and the bi-level test signal from the capture cell, and determine whether the proof sequence is identical to the binary test sequence of the bi-level test signal.

2. The synchronous circuit of claim 1, the capture clock signal of a first one of the one or more validation circuits further includes a positive clock skew between the capture clock signal and the launch clock signal, the first one of the one or more validation circuits to detect hold time violations, warnings, and errors based on the capture clock signal of the first one of the one or more validation circuits.

3. The synchronous circuit of claim 2, wherein the positive clock skew is equal to or greater than a maximum possible positive clock skew between sequentially-adjacent stateful elements of the functional circuitry, and wherein the bi-level test signal of the first one of the one ore validation circuits has a signal propagation time from the test signal generator to the capture cell which is as short as or shorter than a minimum possible signal propagation time between sequentially-adjacent elements of the functional circuitry.

4. The synchronous circuit of claim 1, the capture clock signal of a fast one of the one or more validation circuits further includes a negative clock skew between the capture clock signal and the launch clock signal, the first one of the one or more validation circuits to detect setup time violations, warnings, and errors based on the capture clock signal of the first one of the one or more validation circuits.

5. The synchronous circuit of claim 4, wherein the negative clock skew is equal to or greater than a maximum possible negative clock skew between sequentially-adjacent stateful elements of the functional circuitry, and wherein the level test signal of the first one of the one or more validation circuits has a signal propagation time from the test signal generator to the capture cell which is as long as or longer than a maximum possible signal propagation time between sequentially-adjacent elements of the functional circuitry.

6. The synchronous circuit of claim 1, the capture clock signal of a first one of the one or more validation circuits further includes clock skew between the launch clock signal and the capture clock signal which is substantially zero, the bi-level test signal of the first one of the one or more validation circuits has a signal propagation time from the test signal generator to the capture cell which is as long as or longer than a maximum possible signal propagation time between sequentially-adjacent stateful elements of the functional circuitry, and the first one of the one or more validation circuits to detect clock period violations, warnings, and errors based on the capture clock signal and the bi-level test signal of the first one of the one or more validation circuits.

7. The synchronous circuit of claim 1, each of the one or more validation circuits further comprises one or more non-clocked logic cells connected in series, the capture cell coupled to the test signal generator via the non-clocked logic cells, wherein each of the non-clocked logic cells is taken from a standard cell library as used by a synthesis program when generating logic from a RTL description.

8. The synchronous circuit of claim 7, wherein none of said non-clocked logic cells requires any specific trimming, calibration, or manual intervention to ensure at least one of its correct timing and its correct behavior.

9. The synchronous circuit of claim 1, the clock distribution network further comprises a launch clock path for the clock distribution network to provide the launch clock signal to the test signal generator and a capture clock path for the clock distribution network to provide the capture clock signal to the capture cell, at least one of the launch clock path and the capture clock path comprises one or more non-clocked logic cells connected in series.

10. The synchronous circuit of claim 1, wherein the test signal generator further comprises:
a launch cell having a state input and a state output; and
a feedback loop which connects the state output back to the state input.

11. The synchronous circuit of claim 1, the one or more validation circuits further include a first validation circuit and a second validation circuit, the first validation circuit has a first timing violation detection threshold and the second validation circuit has a second timing violation detection threshold which is different from the first timing violation detection threshold.

12. A method performed by a computer system of designing the synchronous circuit of one of claim 1, the method comprising:
providing a Register Transfer Level, RTL, description of the synchronous circuit which includes an RTL description of the one or more validation circuits;
determining a set of synchronous circuit constraints; and executing a synthesis program on a computer on the basis of the RTL description and the synchronous circuit constraints.

13. The method of claim 12, wherein the one or more validation circuits generated by the synthesis program are to verify a portion of the constraints that is associated with corresponding functional circuitry during execution time of the synchronous circuitry.

14. The method of claim 13, wherein the set of synchronous circuit constraints comprises a set of functional circuitry constraints and a set of validation circuit constraints and wherein the operation of determining the synchronous circuit constraints comprises:
determining the validation circuit constraints on the basis of one or more of the functional circuitry constraints,
wherein the determined validation circuit constraints are derived such that the corresponding timing information for the validation circuitry, in particular the setup timing or hold timing or clock period timing is arranged to exceed the corresponding timing information for any related path within the functional circuitry up to one of a maximum timing violation detection threshold.

15. The method of claim 12, wherein the set of synchronous circuit constraints comprises a set of functional circuitry constraints and a set of validation circuit constraints and wherein the operation of determining the synchronous circuit constraints comprises:
determining the validation circuit constraints on the basis of one or more of the functional circuitry constraints,
wherein the determined validation circuit constraints are derived such that the corresponding timing information for the validation circuitry, in particular the setup timing or hold timing or clock period timing is arranged to exceed the corresponding timing information for any related path within the functional circuitry up to one of a maximum timing violation detection threshold.

16. The synchronous circuit of claim 1, wherein the one or more validation circuits validate the synchronization of the functional circuitry while the functional circuitry is in a functional mode of operation.

17. The synchronous circuit of claim 1, the functional circuitry to perform a functional action based on output of the one or more validation circuits.

18. A method performed by a computer system of validating a synchronous circuit, wherein the synchronous circuit comprises:
a clock source;
functional circuitry coupled to the clock source so as to be clocked by the clock source; and
one or more validation circuits coupled to the clock source so as to be clocked b the clock source, the one or more validation circuits to validate synchronization of the functional circuitry, each of the one or more validation circuits comprises:
a clock distribution network coupled to the dock source;
a test signal generator coupled to the clock distribution network;
a capture cell coupled to the clock distribution network and the test signal generator; and
a verification unit coupled to the capture cell;
wherein the method comprises:
providing, by the clock distribution network, a launch clock signal and a capture clock signal, the launch clock signal and the capture clock signal having the same clock rate;
receiving, by the test signal generator, the launch clock signal from the clock distribution network;
producing, by the test signal generator, a bi-level test signal based on trigger edges of the launch clock signal, the bi-level test signal representing a binary test sequence;
receiving, by the capture cell, the capture clock signal from the clock distribution network and the bi-level test signal from the test signal generator;
generating, by the capture cell, a proof sequence by sampling the bi-level test signal based on trigger edges of the capture clock signal;
receiving, by the verification unit, the proof sequence and the bi-level test signal from the capture cell; and
determining, by the verification unit, whether the proof sequence is identical to the binary test sequence of the bi-level test signal.

19. A synchronous circuit comprising:
synchronous circuit comprising:
a clock source;
functional circuitry coupled to the clock source so as to be clocked by the clock source; and
one or more validation circuits coupled to the clock source so as to be clocked by the clock source, the one or more validation circuits to validate synchronization of the functional circuitry while the functional circuitry is in a functional mode of operation, each of the one or more validation circuits including:
a clock distribution network coupled to the clock source to provide a launch clock signal and a capture clock signal, the launch clock signal having a clock rate and the capture clock signal having the same clock rate;
a test signal generator coupled to the clock distribution network to receive the launch clock signal and to produce a bi-level test signal based on trigger edges of the launch clock signal, the bi-level test signal representing a binary test sequence;
a capture cell coupled to the clock distribution network and the test signal generator to receive the capture clock signal, to receive the bi-level test signal from the test signal generator, and to sample the bi-level test signal based on triggering edges of the capture clock signal to generate a proof sequence;
a verification unit coupled to the capture cell to receive the proof sequence and the bi-level test signal from the capture cell, and determine whether the proof sequence is identical to the binary test sequence of the bi-level test signal.

20. The synchronous circuit of claim 19, the functional circuitry to perform a functional action based on output of the one or more validation circuits.

* * * * *